Figure 1:
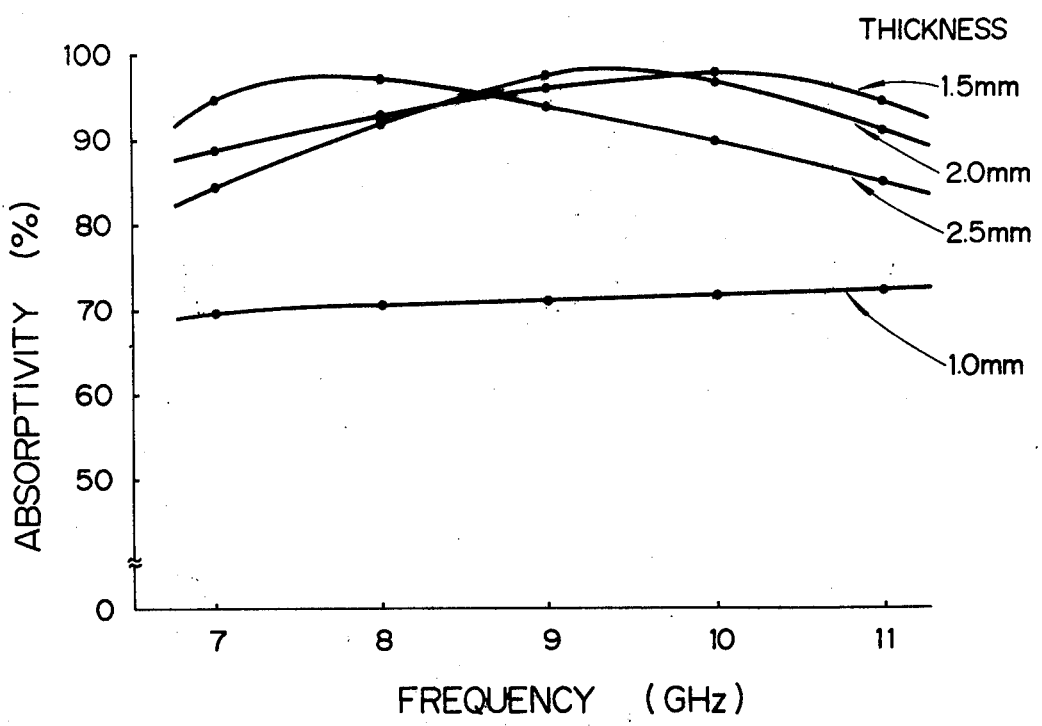

United States Patent [19]

Ishino et al.

[11] 4,116,906
[45] Sep. 26, 1978

[54] COATINGS FOR PREVENTING REFLECTION OF ELECTROMAGNETIC WAVE AND COATING MATERIAL FOR FORMING SAID COATINGS

[75] Inventors: Ken Ishino, Nagareyama; Takashi Watanabe, Tokyo, both of Japan

[73] Assignee: TDK Electronics Co., Ltd., Tokyo, Japan

[21] Appl. No.: 804,784

[22] Filed: Jun. 8, 1977

[30] Foreign Application Priority Data

Jun. 16, 1976 [JP] Japan ............................ 51-74640[U]

[51] Int. Cl.$^2$ ........................ C09D 5/23; C09D 5/32
[52] U.S. Cl. .................................. 260/22 A; 106/290; 106/304; 106/308 M; 252/62.54; 252/62.56; 252/62.6; 252/62.62; 252/62.64; 260/37 R; 260/37 M
[58] Field of Search ............... 260/22 A, 37 R, 37 M; 106/290, 304, 308 M; 252/478, 513, 519, 62.56, 62.6, 62.62, 62.64, 62.54

[56] References Cited

U.S. PATENT DOCUMENTS

| | | | |
|---|---|---|---|
| 3,075,925 | 1/1963 | Dunegan | 252/478 |
| 3,609,372 | 9/1971 | Vogel | 252/478 |
| 3,832,455 | 8/1974 | Smith et al. | 106/304 |
| 3,843,593 | 10/1974 | Shell et al. | 252/62.56 |
| 3,904,421 | 9/1975 | Shimizu et al. | 106/304 |
| 3,904,555 | 9/1975 | Matsuda et al. | 252/513 |
| 3,989,644 | 11/1976 | Bolon et al. | 252/513 |
| 4,017,303 | 4/1977 | Koester et al. | 106/290 |
| 4,042,518 | 8/1977 | Jones | 252/519 |

FOREIGN PATENT DOCUMENTS

| | | | |
|---|---|---|---|
| 48-1,104 | 1/1973 | Japan | 252/478 |
| 651,347 | 3/1951 | United Kingdom | 106/304 |

*Primary Examiner*—Ronald W. Griffin
*Attorney, Agent, or Firm*—Burgess, Ryan and Wayne

[57] ABSTRACT

Coatings (or coat) for preventing reflection of electromagnetic wave on iron structures and coating material for use in forming said coatings, said coatings comprising ferrite powders and iron powders dispersed in organic high molecular weight compounds and said coating material comprising a dispersion of ferrite powders and iron powders contained in a solution of organic high molecular weight compounds dissolved in organic solvents.

7 Claims, 4 Drawing Figures

COATINGS FOR PREVENTING REFLECTION OF ELECTROMAGNETIC WAVE AND COATING MATERIAL FOR FORMING SAID COATINGS

BACKGROUND OF THE INVENTION

It is well known that microwaves from radar systems are reflected by iron structures such as a steel tower or an iron bridge and the reflected microwaves have a bad effect on radar systems.

In order to prevent the reflection of the microwaves, there is provided a microwave absorber such as a so-called rubber ferrite. The rubber ferrite is a mixture of ferrite powders and organic high molecular weight compounds.

The inventors have found that microwaves can more effectively be absorbed by using a mixture of ferrite powders and iron powders.

Thus, it has now been found that the reflection of microwave on a surface of iron structures can effectively be prevented by forming coatings comprising ferrite powders and iron powders dispersed in organic high molecular weight compounds such as synthetic resins or rubbers on a surface of iron structures.

The present invention is based on this discovery.

DESCRIPTION OF THE INVENTION

The present invention relates to coatings for preventing reflection of electromagnetic wave on iron structures and coating material for forming said coatings.

The coatings comprises ferrite powders and iron powders dispersed in organic high molecular weight compounds such as synthetic resins or rubbers and the coating material comprises a dispersion of ferrite powders and iron powders contained in a solution of organic high molecular weight compounds dissolved in organic solvents.

The ferrite is a compound having the general formula $MFe_2O_4$ in which M is a bivalent metal such as Mn, Ni, Co, Mg, Cu, Zn and Cd, and the ferrite powders can be prepared in the way as shown hereinafter.

The iron powders are those obtained by decomposition of iron carbonyl such as $Fe(CO)_5$, $Fe_2(CO)_9$ or $Fe_3(CO)_{12}$. Such iron powders are available in the market.

Particle sizes of the ferrite powders and the iron powders are as follows:

| | |
|---|---|
| Ferrite powder | $1\mu \sim 300\mu$ |
| Iron powder | $1\mu \sim 20\mu$ |

However, ferrite powders having a particle size of about $50\mu$ and iron powders having a particle size of about $6\mu$ are suitably used.

The organic high molecular weight compounds include epoxy resin, silicone resin, alkyd resin, urea resin, phenol resin, melamine resin, acrylic resin, polyvinylchloride, polyvinylacetate, unsaturated polyester resin, phthalic resin, polyamide, polyimide, polyurethane, polystyrene, fluorine-containing rubber, rubber chloride, silicone rubber, butyl rubber, polyisoprene, polybutadiene, chloroprene-copolymer and chlorosulfonated polyethylene.

The organic solvents for use in dissolving the organic high molecular weight compounds include benzene, toluene, xylene, petroleum spirit, petroleum benzine, methyl alcohol, ethyl alcohol, isopropyl alcohol, butyl alcohol, isobutyl alcohol, acetone, methyl ethyl ketone, butyl acetate, cyclohexanol, turpentine oil and trichloroethylene.

The coating of the present invention comprises 20 to 260 parts by weight of ferrite powder, 40 to 680 parts by weight of iron powder and 100 parts by weight of the organic high molecular weight compound.

The coating material for use in forming said coatings can be prepared by mixing the following ingredients in a ball mill.

| | Parts by weight |
|---|---|
| Ferrite powder | 20~260 |
| Iron powder | 40~680 |
| Organic high molecular weight compound | 100 |
| Organic solvent | 20~3000 |

A preferred embodiment of the present invention will be shown below.

Powders of Ni-Zn-ferrite were prepared as follows:
754g of $Fe_2O_3$, 118g of NiO and 128g of ZnO were each weighed out to provide a Ni-Zn-ferrite including 60mol% of $Fe_2O_3$, 20mol% of NiO and 20mol% of ZnO. The $Fe_2O_3$, NiO and ZnO were mixed in a ball mill for 20 hours. The mixture was dried and then heated at a temperature of 1200° C for one hour. The heated mixture was cooled and pulverized by an atomizer to obtain ferrite powders having a particle size of $1\mu$ to $300\mu$.

Coating material No. 1 of the present invention and control Coating materials No. 2 and No. 3 were respectively prepared by mixing the following ingredients in a ball mill for one hour.

| Coating material No. 1: | |
|---|---|
| Ferrite powder (prepared as shown above) | 90g |
| Iron powder (particle size $1\mu$–$20\mu$) | 135g |
| Chlorosulfonated polyethylene (sold by du Pont Co. under the tradename of Hypalon) | 100g |
| Toluene | 650g |
| Coating material No. 2: | |
| Ferrite powder (prepared as shown above) | 225g |
| Chlorosulfonated polyethylene (Hypalon) | 100g |
| Toluene | 650g |
| Coating material No. 3: | |
| Iron powder (particle size $1\mu$–$2\mu$) | 225g |
| Chlorosulfonated polyethylene (Hypalon) | 100g |
| Toluene | 650g |

As shown above, Coating materials No. 2 and No. 3 have respectively ferrite powders or iron powders dispersed in resin instead of a mixture of ferrite powders and iron powders in Coating material No. 1 of the present invention.

Coating materials No. 1, No. 2 and No. 3 were respectively applied on a surface of iron plate and then dried. In this way, iron plates coated with coating materials (No. 1, No. 2 and No. 3) in thickness of 1.0, 1.5, 2.0, 2.5, 3.0, 3.5 and 4.0 mm were obtained, respectively.

The absorption of a microwave on the coated iron plates were measured by using microwaves having a frequency of 7, 8, 9, 10 and 11 GHz, respectively.

The results are shown in the accompanying drawings.

Absorptivity (rate of absorption) is defined as follows:

absorptivity = $(A-B)/A \times 100(\%)$

A: Energy of microwave projected on a coated iron plate

B: Energy of microwave reflected from said coated iron plate

Figure 2:
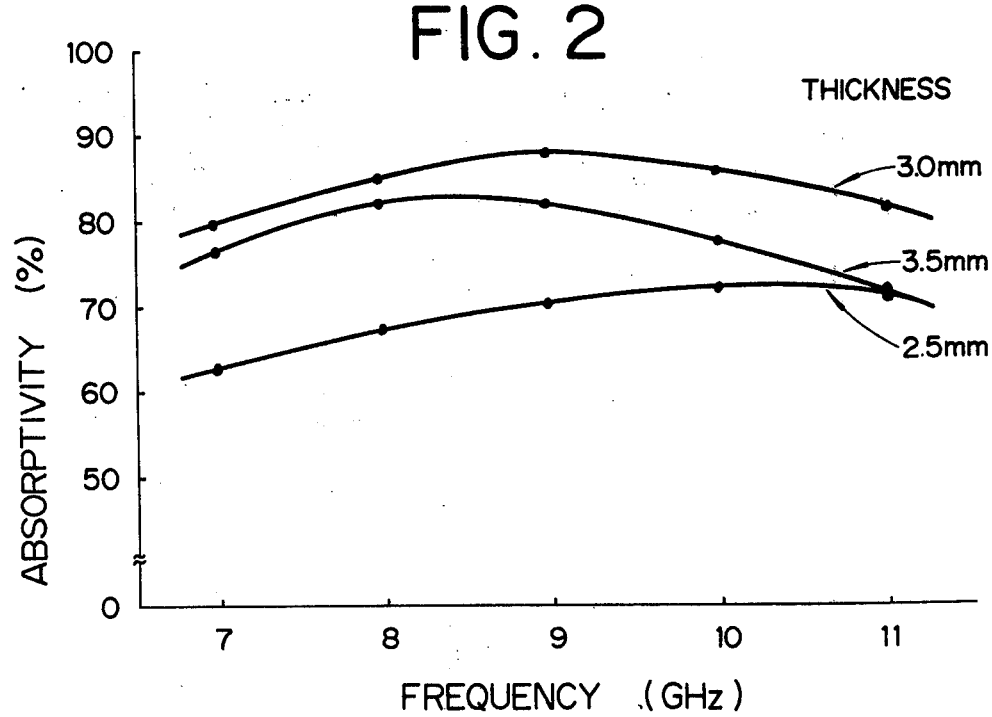
Figure 3:
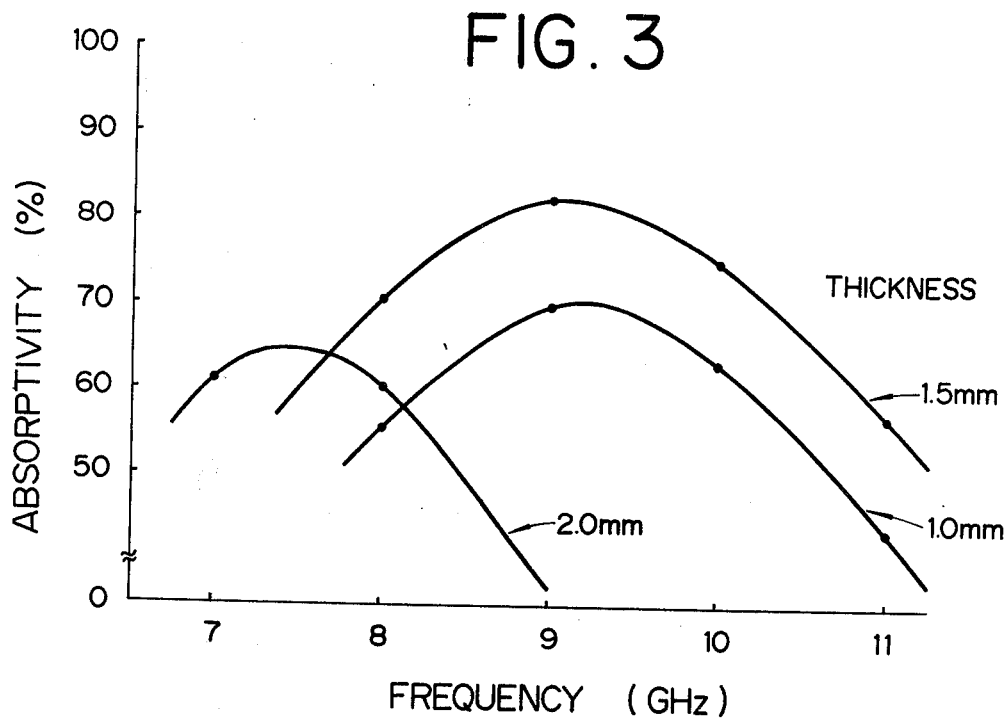

FIG. 1, FIG. 2 and FIG. 3 are graphical representations on coordinates of absorptivity against frequency.

In FIG. 1, the coatings are those formed in the thickness of 1.0, 1.5, 2.0 and 2.5 mm by using Coating material No. 1.

In FIG. 2, the coatings are those formed in the thickness of 2.5, 3.0 and 3.5 mm by using Coating material No. 2.

In FIG. 3, the coatings are those formed in the thickness of 1.0, 1.5 and 2.0 mm by using Coating material No. 3.

Figure 4:
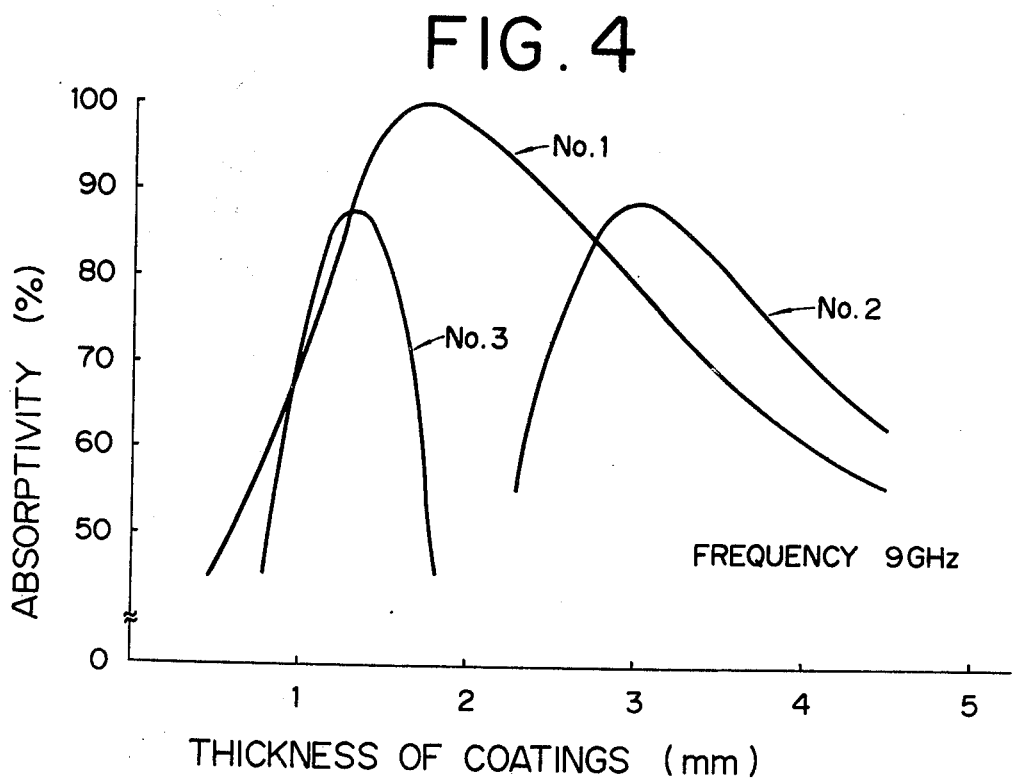

In FIG. 4, is a graphical representation on coordinates of absorptivity against thickness of coatings in the frequency of 9 GHz, said coatings having been formed by using Coating materials No. 1, No. 2 and No. 3, respectively.

As can be seen from the results as shown in the FIGS. 1 to 4, the coatings containing ferrite powders and iron powders are superior to coatings containing either ferrite powders or iron powders in the absorption of microwave.

Coatings containing ferrite powders and iron powders as shown hereinbefore can most effectively be used in a thickness of 1.5 mm to 2.5 mm for absorbing microwaves of 7 to 11 GHz in frequency.

The reflection of electromagnetic wave on iron structures can effectively be prevented by coatings formed from coating materials of the present invention.

We claim:

1. Coatings for preventing a reflection of electromagnetic waves on iron structures, comprising 20–260 parts by weight of a ferrimagnetic ferrite powder having a particle size of 1–300μ selected from the group consisting of compounds having the formula $MFe_2O_4$ in which M is a bivalent metal selected from the group consisting of Mn, Ni, Co, Mg, Cu, Zn, and Cd; and 40–680 parts by weight of an iron powder having a particle size of 1–20μ dispersed in 100 parts by weight of a film forming polymer.

2. Coatings according to claim 1 wherein said iron powder is prepared by decomposition of iron carbonyl.

3. Coatings according to claim 1 wherein said polymer is selected from the group consisting of epoxy resin, silicone resin, alkyd resin, urea resin, phenol resin, melamine resin, acrylic resin, polyvinylchloride, polyvinylacetate, unsaturated polyester resin, phthalic resin, polyamide, polyimide, polyurethane, polystyrene, fluorine-containing rubber, rubber chloride, butyl rubber, polyisoprene, polybutadiene, and chlorosulfonated polyethylene.

4. Coating material comprising a dispersion of 20–260 parts by weight of a ferrimagnetic ferrite powder having a particles size of 1–300μ selected from the group consisting of compounds having the formula $MFe_2O_4$ in which M is a bivalent metal selected from the group consisting of Mn, Ni, Co, Mg, Cu, Zn, and Cd; and from 40–680 parts by weight of an iron powder having a particle size of 1–20μ contained in a solution of 100 parts by weight of a film-forming polymer dissolved in 20–3,000 parts by weight of an organic solvent.

5. Coating material according to claim 4 wherein said iron powder is prepared by decomposition of iron carbonyl.

6. Coating material according to claim 4 wherein said polymer is selected from the group consisting of epoxy resin, silicone resin, alkyd resin, urea resin, phenol resin, melamine resin, acrylic resin, polyvinylchloride, polyvinylacetate, unsaturated polyester resin, phthalic resin, polyamide, polyimide, polyurethane, polystyrene, fluorine-containing rubber, rubber chloride, butyl rubber, polyisoprene, polybutadiene, and chlorosulfonated polyethylene.

7. Coating material according to claim 4 wherein said organic solvent is benzene, toluene, xylene, petroleum spirit, petroleum benzine, methyl alcohol, ethyl alcohol, isopropyl alcohol, butyl alcohol, isobutyl alcohol, acetone, methyl ethyl ketone, butyl acetate, cyclohexanol, turpentine oil and trichloroethylene.

* * * * *

UNITED STATES PATENT OFFICE
CERTIFICATE OF CORRECTION

Patent No. 4,116,906                Dated September 26, 1978

Inventor(s) Ken Ishino, et al

It is certified that error appears in the above-identified patent and that said Letters Patent are hereby corrected as shown below:

On the Title Page, under "Foreign Application Priority Data": "51-74640[U]" should be --51-78567[U]--.

Column 1, line 32:  "comprises" should be --comprise--.

Column 4, line 17:  "particles" should be --particle--.

Signed and Sealed this

First Day of May 1979

[SEAL]

Attest:

RUTH C. MASON
Attesting Officer

DONALD W. BANNER
Commissioner of Patents and Trademarks